United States Patent
Hoff et al.

(10) Patent No.: US 9,431,927 B2
(45) Date of Patent: Aug. 30, 2016

(54) SYSTEM FOR HARVESTING ENERGY FROM DOOR OR DOOR HARDWARE MOVEMENT

(71) Applicant: XceedID Corporation, Golden, CO (US)

(72) Inventors: Bryan D. Hoff, Boulder, CO (US); Samir M. Tamer, San Jose, CA (US)

(73) Assignee: XceedID Corporation, Golden, CO (US)

( * ) Notice: Subject to any disclaimer, the term of this patent is extended or adjusted under 35 U.S.C. 154(b) by 661 days.

(21) Appl. No.: 13/888,798

(22) Filed: May 7, 2013

(65) Prior Publication Data

US 2013/0293067 A1 Nov. 7, 2013

Related U.S. Application Data

(60) Provisional application No. 61/643,416, filed on May 7, 2012.

(51) Int. Cl.
*H01L 41/113* (2006.01)
*H02N 2/18* (2006.01)
*H01L 41/083* (2006.01)

(52) U.S. Cl.
CPC .............. *H02N 2/18* (2013.01); *H01L 41/083* (2013.01); *H01L 41/1134* (2013.01)

(58) Field of Classification Search
CPC ........ H02N 2/18; H02N 2/183; H02N 2/186; F23Q 3/002; H01L 41/1136
USPC .......................................... 310/339
See application file for complete search history.

(56) References Cited

U.S. PATENT DOCUMENTS

| 3,350,583 | A | * | 10/1967 | Schiavone | .................... | 310/319 |
| 4,853,580 | A | * | 8/1989 | Sula | .............................. | 310/339 |
| 5,632,169 | A | | 5/1997 | Clark et al. | | |
| 6,060,817 | A | * | 5/2000 | Mullen et al. | ................ | 310/339 |
| 6,236,118 | B1 | | 5/2001 | Vasija et al. | | |

(Continued)

FOREIGN PATENT DOCUMENTS

| DE | | 3208818 A1 | * | 9/1983 | ............. | E05B 47/00 |
| JP | | 2000204806 | | 7/2000 | | |

(Continued)

OTHER PUBLICATIONS

Litwhiler et al., "Energy Harvesting: Measurement and Analysis of Swing Doors" (2008) Journal of Engineering Technology, 3 pages.

(Continued)

*Primary Examiner* — Thomas Dougherty
(74) *Attorney, Agent, or Firm* — Michael Best & Friedrich LLP (57) ABSTRACT

An electrical generation system for a doorway including a door includes a lock mechanism movable between an engaged position and a disengaged position to allow the door to move between a closed position and an open position and a cam coupled to the door. A piezo-electric generator is coupled to the cam. The cam is rotatable with respect to the piezo-electric generator. The piezo-electric generator is operable to produce an electrical current in response to rotation of the cam with respect to the piezo-electric generator, and the electrical current has a frequency that is greater than the number of revolutions made by the cam with respect to the piezo-electric generator.

22 Claims, 11 Drawing Sheets

(56) References Cited

U.S. PATENT DOCUMENTS

| | | | |
|---|---|---|---|
| 6,307,304 B1 * | 10/2001 | Yorio et al. | 310/339 |
| 6,700,310 B2 | 3/2004 | Maue et al. | |
| 6,933,655 B2 | 8/2005 | Morrison et al. | |
| 7,795,746 B2 | 9/2010 | Riley et al. | |
| 2003/0218541 A1 | 11/2003 | Sakai | |
| 2005/0269907 A1 * | 12/2005 | Erickson | 310/339 |
| 2006/0242908 A1 | 11/2006 | McKinney | |
| 2007/0268132 A1 | 11/2007 | Milo | |
| 2009/0212665 A1 | 8/2009 | Koser et al. | |
| 2010/0052324 A1 * | 3/2010 | Priya | 290/50 |
| 2010/0187832 A1 | 7/2010 | Holland et al. | |
| 2010/0290138 A1 | 11/2010 | Thomas et al. | |
| 2011/0252845 A1 | 10/2011 | Webb et al. | |

FOREIGN PATENT DOCUMENTS

| | | | | |
|---|---|---|---|---|
| JP | 2003-296827 A | * | 10/2003 | G08B 13/08 |
| KR | 100639235 | | 10/2006 | |
| RU | 13152 | * | 8/2013 | H02N 2/18 |

OTHER PUBLICATIONS

Piezo Systems, "Piezoelectric Energy Harvesting Kit" <http://www.piezo.com/prodproto4EHkit.html> webpage available as early as May 4, 2007.

Electronrun, "Revolving Doors, Piezoelectric Floors finally get Energy Harvesting going", <http://electronrun.com/wp_er/2008/12/11/revolving-doors-piezoelectric-floors-finally-get-energy-harvesting-going/> webpage available as early as Dec. 15, 2008.

PCT/US2013/039875/International Search Report and Written Opinion dated Sep. 26, 2013 (8 pages).

* cited by examiner

SYSTEM FOR HARVESTING ENERGY FROM DOOR OR DOOR HARDWARE MOVEMENT

RELATED APPLICATION DATA

This application claims priority to U.S. Provisional Application No. 61/643,416 filed May 7, 2012, the entire contents of which are incorporated herein by reference.

BACKGROUND

The present invention relates to a system for harvesting energy from the movement of the opening or closing of a door, or the movement of various types of hardware on a door (such as a handle or door lock).

SUMMARY

In one aspect, the invention provides an electrical generation system for a doorway including a door. The system includes a lock mechanism movable between an engaged position and a disengaged position to allow the door to move between a closed position and an open position and a cam coupled to the door. A piezo-electric generator is coupled to the cam. The cam is rotatable with respect to the piezo-electric generator. The piezo-electric generator is operable to produce an electrical current in response to rotation of the cam with respect to the piezo-electric generator, and the electrical current has a frequency that is greater than the number of revolutions made by the cam with respect to the piezo-electric generator.

In another embodiment, the invention provides an electrical generation system for a doorway including a door. The system includes a lock mechanism including a lock and a handle. The handle is movable to move the lock between an engaged position and a disengaged position to allow movement of the door between a closed position and an open position. A cam is coupled to the door and includes a cam axis and a first surface having a plurality of bumps and a plurality of recesses therebetween. A roller is in direct contact with the cam and is positioned to engage the bumps and recesses. One of the roller and the cam is movable about the cam axis with respect to the other of the roller and the cam such that the movement produces a cyclic movement of the roller. A cam driver is coupled to the roller and is cyclically movable in response to cyclic movement of the roller. A piezo-electric element is coupled to the cam driver and is operable in response to movement of the cam driver to produce an alternating electric current in which each cycle starts when the roller is in contact with a first of the plurality of bumps and ends when the roller is in contact with a second of the plurality of bumps, the second bump being adjacent the first bump.

In another embodiment, the invention provides an electrical generation system for a doorway. The system includes a door slidably supported within the doorway and movable between a closed position and an open position. The door includes a first surface that moves along a substantially linear path as the door moves between the open position and the closed position. A plurality of bumps is positioned along the first surface, each bump cooperating with an adjacent bump to define a recess therebetween. A cam driver is coupled to the first surface. The cam driver is movable into sequential contact with each of the plurality of bumps in response to movement of the door between the open position and the closed position. A piezo-electric element is coupled to the cam driver and is operable in response to movement of the cam driver to produce an alternating electric current in which each cycle starts when the cam driver is adjacent a first of the plurality of bumps and ends when the cam driver is adjacent a second of the plurality of bumps, the second bump being adjacent the first bump.

In another construction, the invention provides an electrical generation system for a building opening. The system includes a stationary frame surrounding at least a portion of the opening, a movable member supported in the frame for movement between an open position and a closed position, and a liner positioned between the stationary frame and the movable member. The liner deflects in response to movement of the movable member. A piezo electric element is coupled to the liner and is operable to generate an electric current in response to the deflection of the liner.

Other aspects of the invention will become apparent by consideration of the detailed description and accompanying drawings.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

DETAILED DESCRIPTION

The present invention provides various embodiments of doors and door systems that include an electrical generation system that utilizes piezo-electric generators to generate electricity from the movement of a door, or the movement of various door related mechanisms. The electricity from such electrical generation systems can be used to directly power electronic door accessories such as an electric door lock, security keypads, lights, door openers, biometric security devices (such as fingerprint readers, etc.), or other such powered devices. In other arrangements, the piezo-electric generators are used to recharge the batteries that power the aforementioned accessories.

In one embodiment, the electrical generation system includes a door mechanism, a cam and a piezo electric generator mechanism. The door mechanism can be any moving mechanism that is utilized on a door, such as a door handle, door lock, door closer, or the door itself. In one construction, a cam is operatively connected to the door mechanism so that when the door mechanism is actuated, the movement of the door mechanism imparts movement to the cam.

Figure 1:
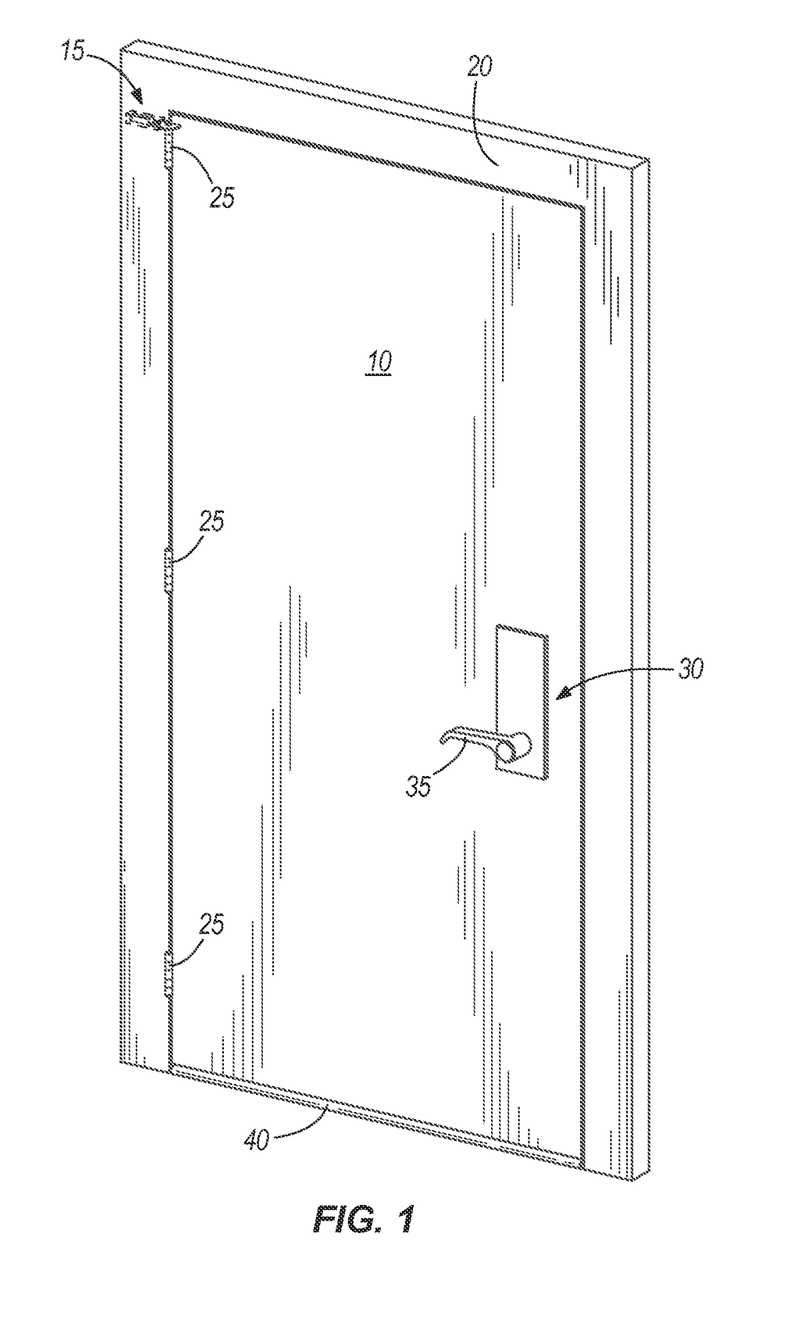
FIG. 1 is a perspective view of a door including a door lock and an electrical generation system.

FIG. 1 illustrates a simplified version of a door 10 that includes a piezo-electric generator mechanism 15 of the invention. As illustrated in FIG. 1, the door 10 is supported within a door frame 20 by three hinges 25 that allow the door 10 to pivot about a hinge axis. A lock mechanism 30 is positioned within the door 10 and is operable to selectively engage the door frame 20 to maintain the door 10 in a closed position. A handle 35 extends from the lock mechanism 30 and is actuatable by a user to selectively engage or disengage the lock mechanism 30 and the frame 20 to allow the user to open and close the door 10. In preferred constructions, weather stripping 40 (sometimes referred to as a door frame liner) or other flexible items are positioned between the door 10 and the door frame 20 such that when the door 10 is closed, a better seal is formed between the door 10 and the door frame 20.

Figure 2:
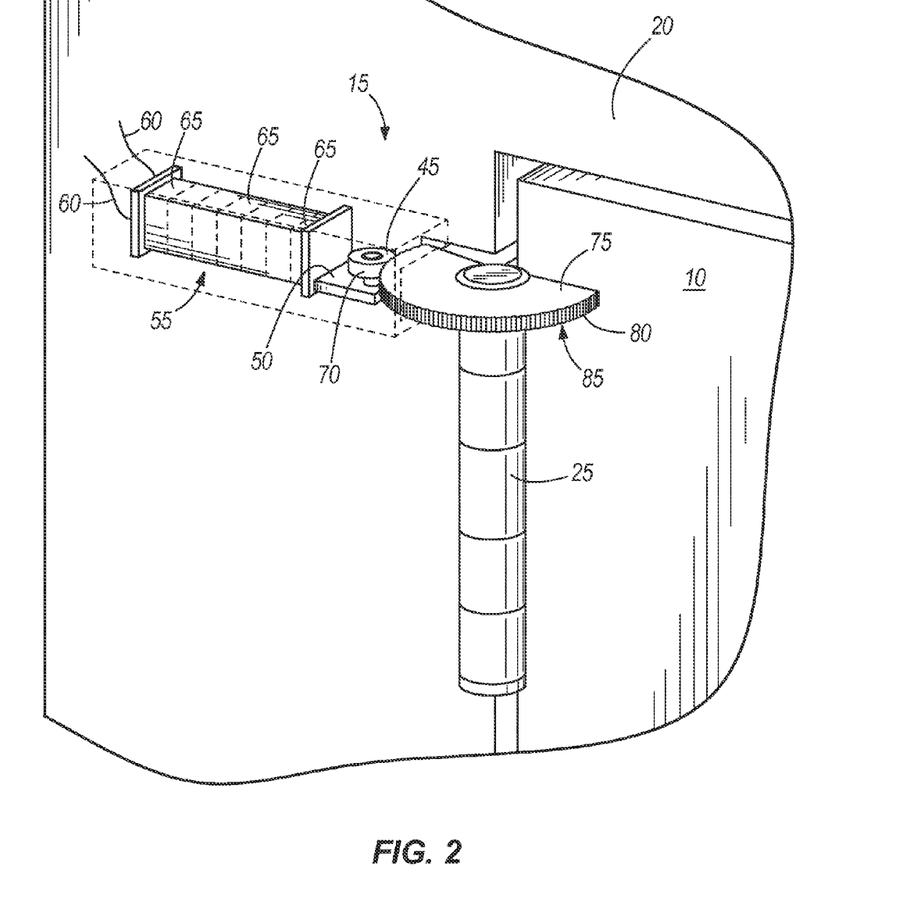
FIG. 2 is an enlarged perspective view of a portion of the door of FIG. 1 illustrating the electrical generation system.

The piezo-electric generator 15, better illustrated in FIG. 2 includes a roller 45, a cam driver 50, a piezo-electric member 55, and electrical conductors 60 or wires that direct the generated electricity to a point-of-use. In preferred constructions, the piezo-electric member 55 includes a stack of piezo-electric elements 65 arranged such that an applied force on one of the elements 65 is applied to all of the elements 65. The piezo-electric member 55 used in the piezo-electric generator mechanism 15, can be any suitable commercially available piezo-electric member 55.

The cam driver 50 is positioned adjacent the piezo-electric member 55 and engages the member 55 such that any displacement of the cam driver 50 is translated to the piezo-electric member 55. In the illustrated construction, the cam driver 50 includes a rectangular cross-section bar that extends from the piezo-electric member 55 and supports the roller 45. Other shapes and arrangements of the cam driver 50 are also possible.

As illustrated in FIG. 2, the roller 45 includes a cylindrical wheel that is supported for rotational movement by the cam driver 50. The outer surface 70 of the roller 45 is substantially smooth and is positioned to engage a cam 75.

The cam 75 includes a cylindrical wheel with a plurality of bumps 80 formed on the outermost cylindrical surface 85. The cam 75 is coupled to the uppermost hinge 25 in the illustrated construction such that the cam 75 rotates with the door 10 as it is opened and closed. The bumps 80 of the cam 75 are sized and spaced such that the roller 45 moves in a substantially radial direction as the cam 75 rotates. For example, if one selected a piezo-electric member 55 that efficiently operates when excited at 50 Hz for use on a door that moved through 90 degrees of rotation in 10 seconds, one would provide a cam 75 having about 2000 bumps 80 around the circumference. Each bump 80 would have a height about equal to the desired displacement (e.g., 0.005 inches, 0.13 mm) and the roller 45 would be sized to fit between the bumps 80 to give the desired displacement at the cam driver 50.

The cam and roller interface is designed to apply pressure to the roller 45 as it moves on the surface of the cam 75. The roller 45 in turn moves the cam driver 50. The cam driver 50 can be any structural component that links the roller 45 to the piezo-electric member 55. As the cam driver 50 is moved it actuates the piezo-electric member 55, which in turn generates electricity in response to the deformations imparted to the piezo-electric elements 65.

Suitably, the cam and roller interface is designed such that there are bumps 80 or depressions on either the cam 75, the roller 45, or both, such that the movement of the cam 75 over the roller 45 creates a frequency and amplitude of movement in the cam driver 50 that actuates the piezo-electric member 55 in an efficient fashion. Suitably, in one embodiment, the bump 80 or depression arrangement on the cam 75 or the roller 45 is such that the piezo-electric member 55 is actuated at a frequency of about between 50-200 Hz with an amplitude of about 1-10 thousandths of an inch (0.025-0.25 mm).

Figure 3:
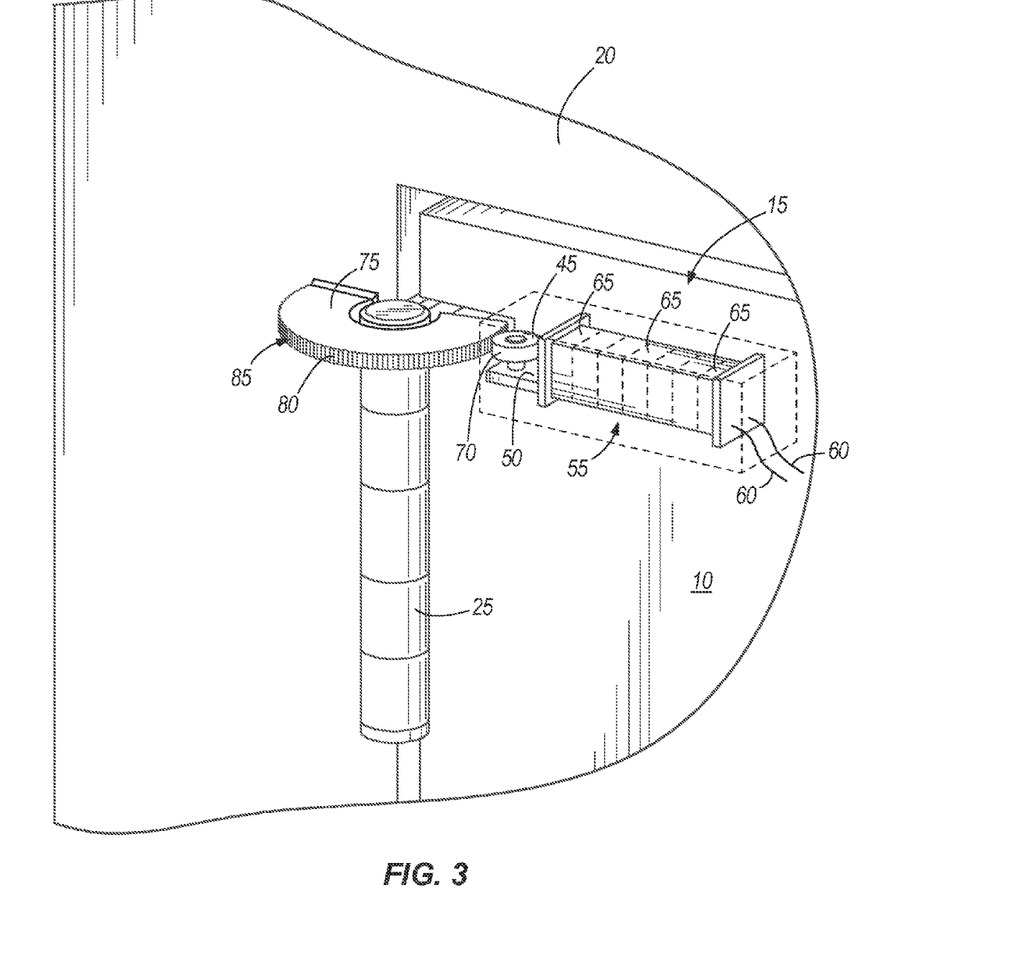
FIG. 3 is a perspective view of another electrical generation system suitable for use with the door of FIG. 1.

The piezo-electric generator 15 of FIG. 2 remains stationary while the cam 75 rotates with the hinge 25 to provide the desired excitation of the piezo-electric member 55. FIG. 3 illustrates another construction in which the piezo-electric generator 15 is coupled to and moves with the door 10 while the cam 75 remains fixed. Thus, the piezo-electric generator 15 rotates around the cam 75 to produce the same excitation as was provided with the construction of FIG. 2. The construction of FIG. 3 is advantageous in that the wiring 60 from the piezo-electric member 55 can be directly connected to the device being powered or the batteries 90 (shown in FIG. 11) being charged if they are also coupled to the door 10 without having to pass wires between the stationary frame 20 and the moving door 10. One of ordinary skill in the art will realize that the cam 75 and the piezo-electric generator 15 can be positioned in many different ways without deviating from the invention. In addition, one of ordinary skill in the art will realize that while the cam 75 illustrated in FIGS. 1-3 is shown as being completely cylindrical, other constructions could use a portion or sector of the cylinder since most doors 10 rotate less than about 180 degrees.

Figure 4:
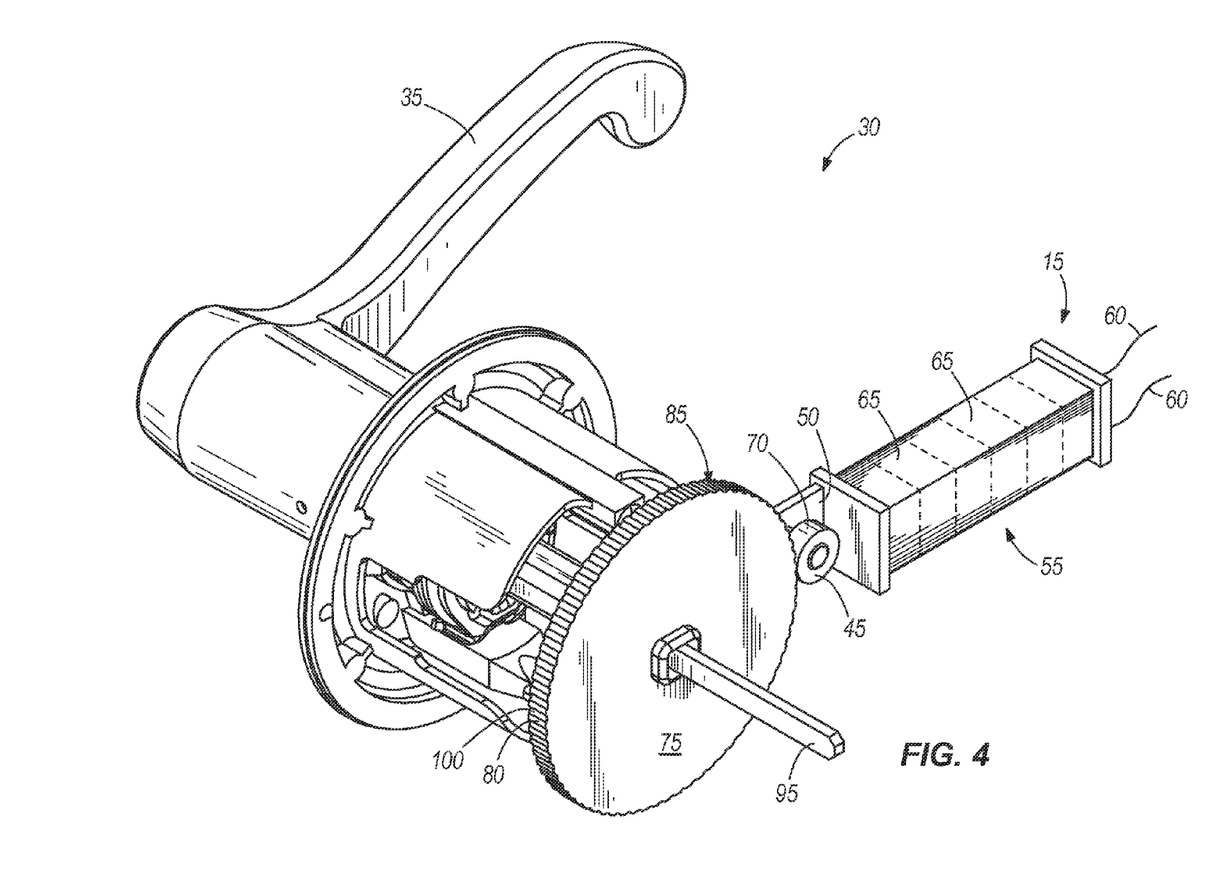
FIG. 4 is a perspective view of another electrical generation system suitable for use with the door and the door lock of FIG. 1.

Another construction of the electrical generation system that could be used alone, or with the construction of FIGS. 1-3, is shown in FIG. 4. The door handle 35 is connected to a spindle 95 which operatively supports the cam 75. The cam 75 is operatively connected to the spindle 95 such that when the handle 35 is turned, both the spindle 95 and the connected cam 75 rotate together. The cam 75 outer circumference 85 has bumps 80 and depressions 100 situated thereon.

The roller 45 is positioned to be in connection with the outer circumference 85 of the cam 75, such that when the cam 75 is turned, a portion of the outer circumference 85 of the cam 75 rolls across the roller 45, the roller 45 traveling over the bumps 80 and depressions 100 causing the roller 45 to move the cam driver 50 to actuate the piezo-electric member 55. As discussed with regard to FIGS. 1-3, the bumps 80 are sized and spaced to provide the desired excitation frequency and amplitude for the piezo-electric member 55 during normal rotation of the handle 35.

Figure 5:
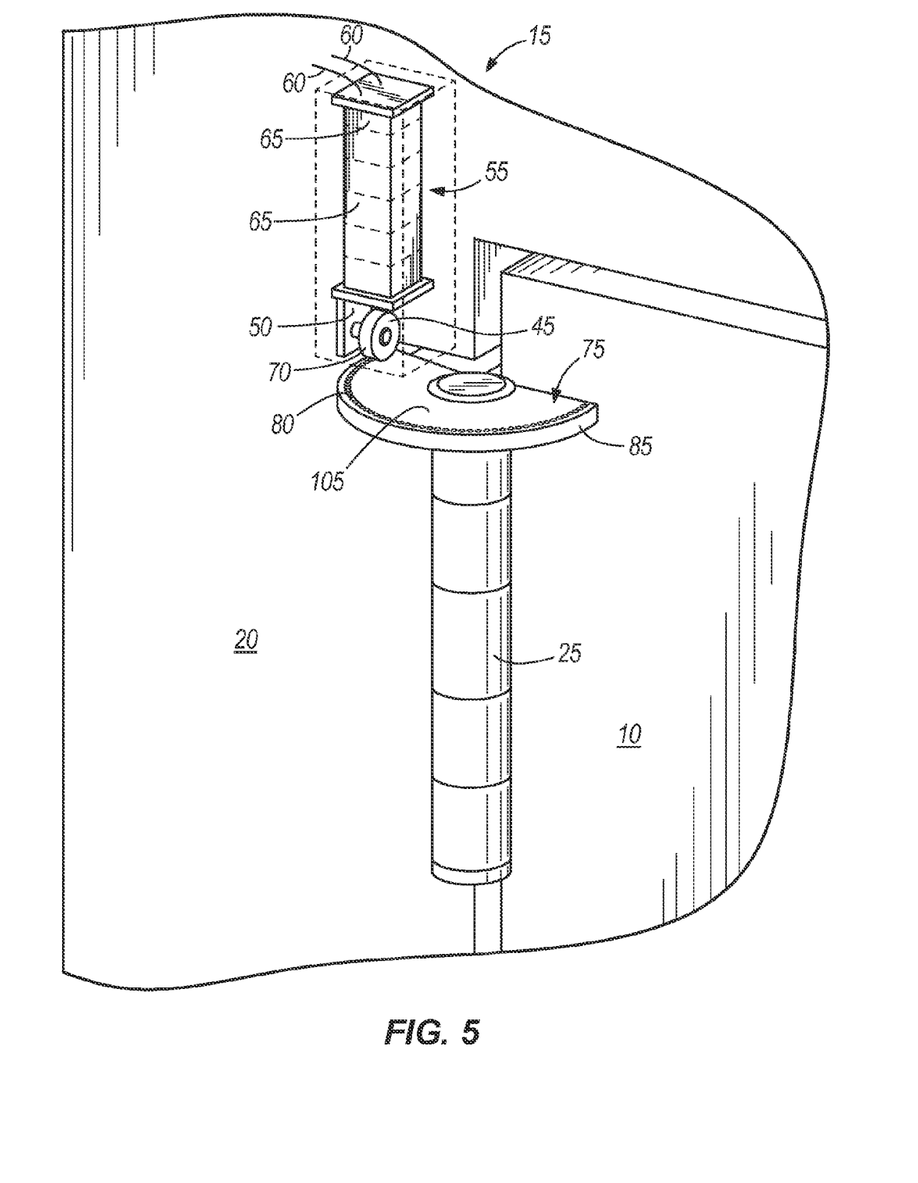
FIG. 5 is a perspective view of another electrical generation system suitable for use with the door of FIG. 1.

FIG. 5 illustrates another arrangement in which the piezo-electric generator 15 is oriented in a direction that is substantially parallel to the hinge axis rather than normal to that axis as illustrated in FIGS. 1-3. In this arrangement, the bumps 80 are moved from the circumferential outer surface 85 of the cam 75 to the outermost edge of one of the substantially planar faces 105 of the cam 75. As with prior constructions, the bumps 80 are sized and spaced to provide excitation of the piezo-electric member 55 at the desired frequency and amplitude. As with the constructions of FIGS. 1-3, the piezo-electric generator 55 could be coupled to the door 10 rather than the frame 20, if desired.

Figure 6:
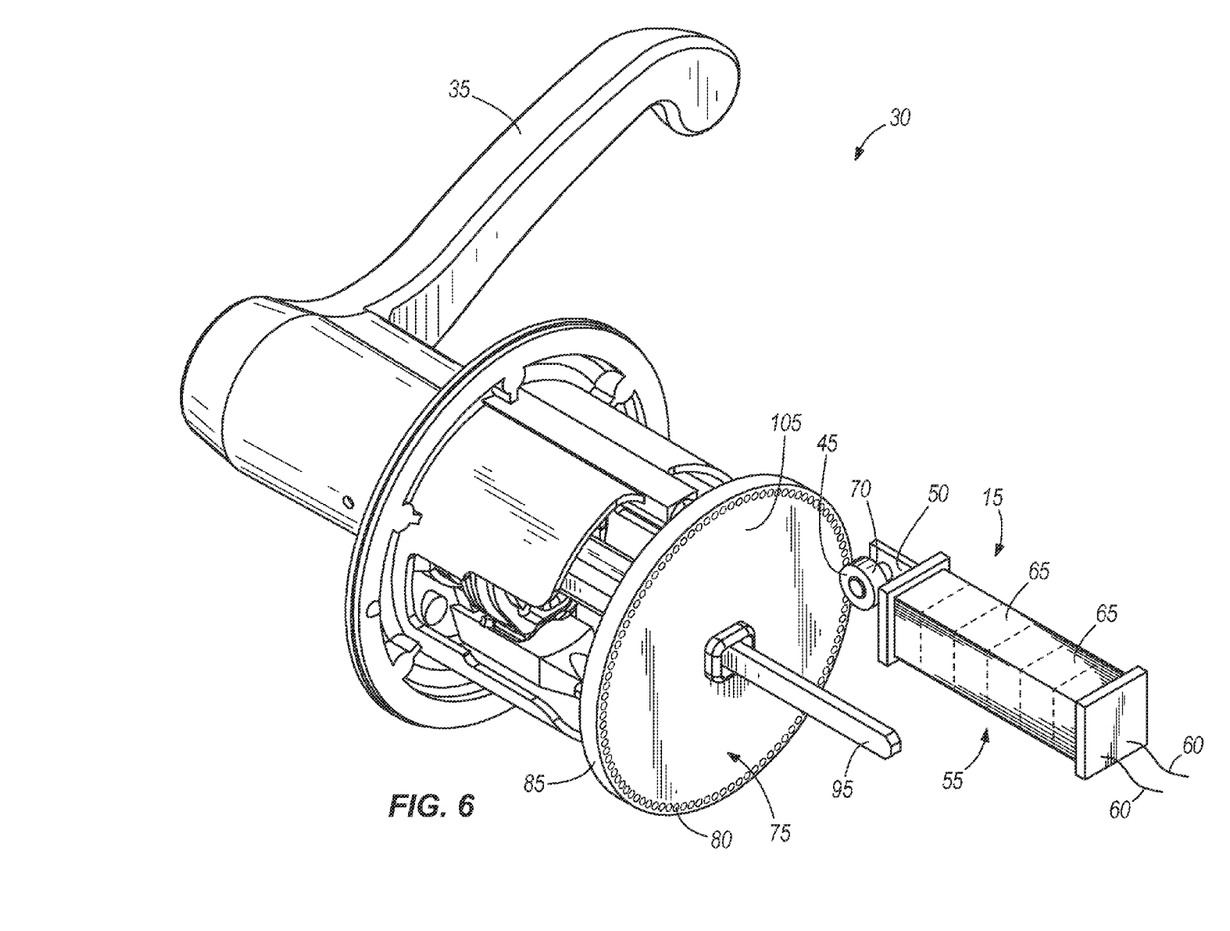
FIG. 6 is a perspective view of another electrical generation system suitable for use with the door and the door lock of FIG. 1.

Another embodiment of the electrical generation system is shown in FIG. 6. A lock mechanism 110 includes a rotating spindle 95 that is operatively connected to the cam 75 such that the rotating spindle 95 and the connected cam 75 rotate together. The cam 75 includes a substantially planar surface 105 that terminates at an outer circumference 85. A plurality of bumps 80 and depressions 100 are formed or attached to the substantially planar surface 105 adjacent the outer circumference 85. The piezo-electric generator 15 is positioned such that the roller 45 contacts the substantially planar surface 105 of the cam 75 and is displaced in a direction that is substantially parallel to the spindle axis in response to the bumps 80 moving past the roller 45 during rotation of the handle 35. As with prior constructions, the bumps 80 are sized and spaced to excite the piezo-electric member 55 at the desired frequency and amplitude.

Figure 7:
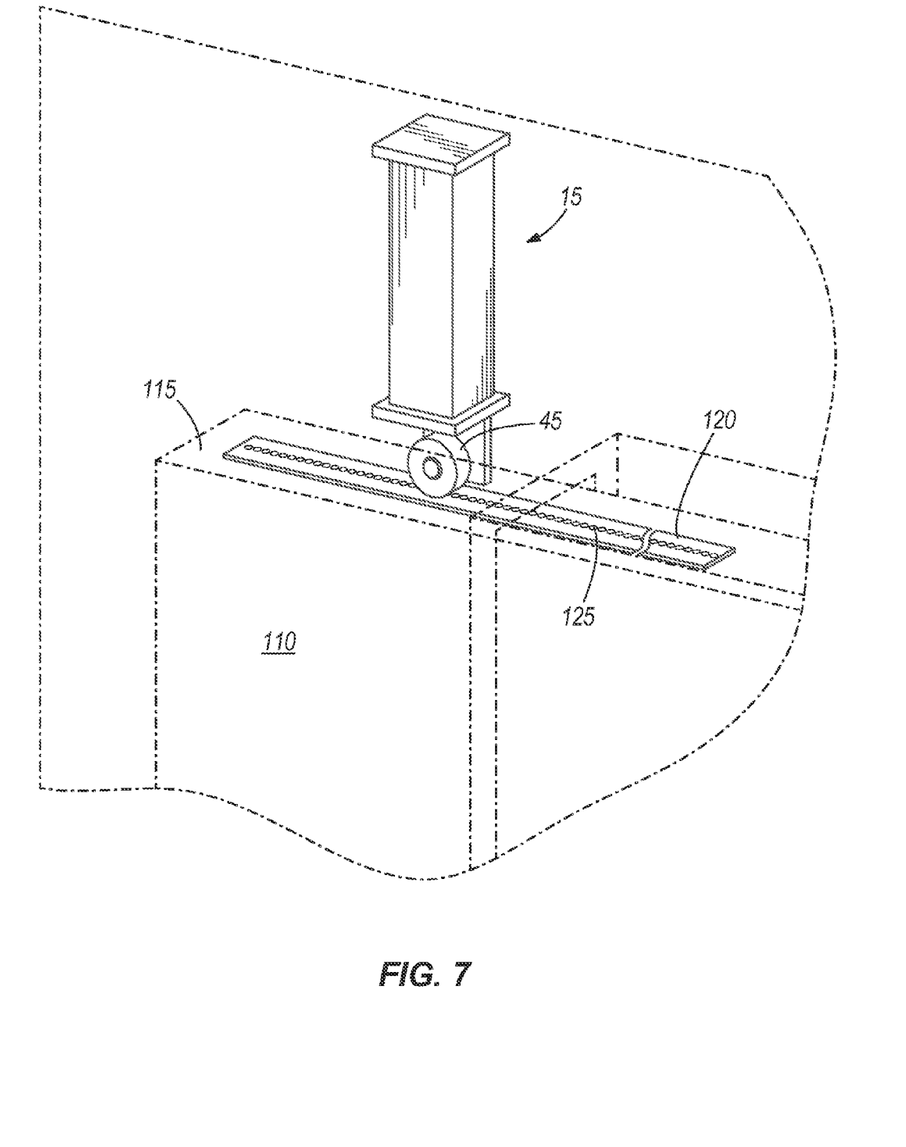
FIG. 7 is a perspective view of another electrical generation system suitable for use with a sliding door.

FIG. 7 illustrates yet another arrangement of the invention. The construction of FIG. 7 is adapted to operate with sliding doors 110 rather than rotating doors 10. The piezo-electric generator 55 is positioned in the door frame 20 adjacent a top or bottom edge 115 of the door 110. A strip 120 is positioned along the adjacent edge 115 of the door 110 and includes a plurality of bumps 125. As with prior constructions, the roller 45 of the piezo-electric generator mechanism 15 engages the bumps 125 and moves in response to the movement of the bumps 125 past the roller 45. As with prior constructions, the bumps 125 are sized and spaced to excite the piezo-electric member 55 at a desired frequency and amplitude. In another construction, the bumpy strip 120 is positioned on the door frame 20 and the piezo-electric generator mechanism 85 is coupled to and moves with the door 110.

Figure 8:
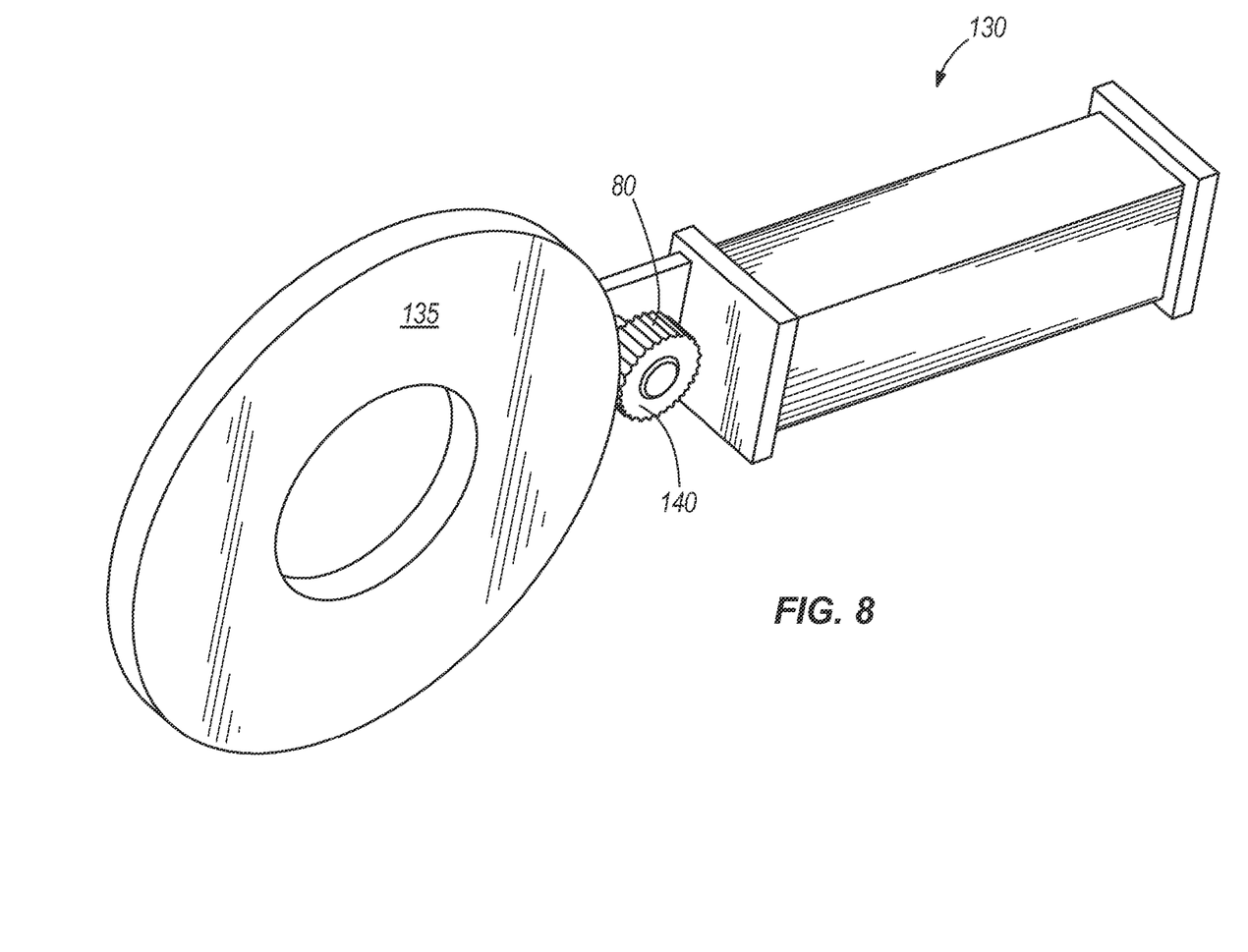
FIG. 8 is a perspective view of an electrical generation system and a cam suitable for use with the door of FIG. 1.

FIG. 8 illustrates an arrangement of a piezo-electric generator mechanism 130 and a cam 135 in which the bumps 80 are applied to a roller 140 rather than a cam 135. This arrangement could be applied to any of the arrangements described herein. The bumps 80, the cam 135, and the roller 140 would all be sized and spaced to provide excitation of the piezo-electric member 55 at the desired frequency and with the desired amplitude.

Figures 9A, 9B:
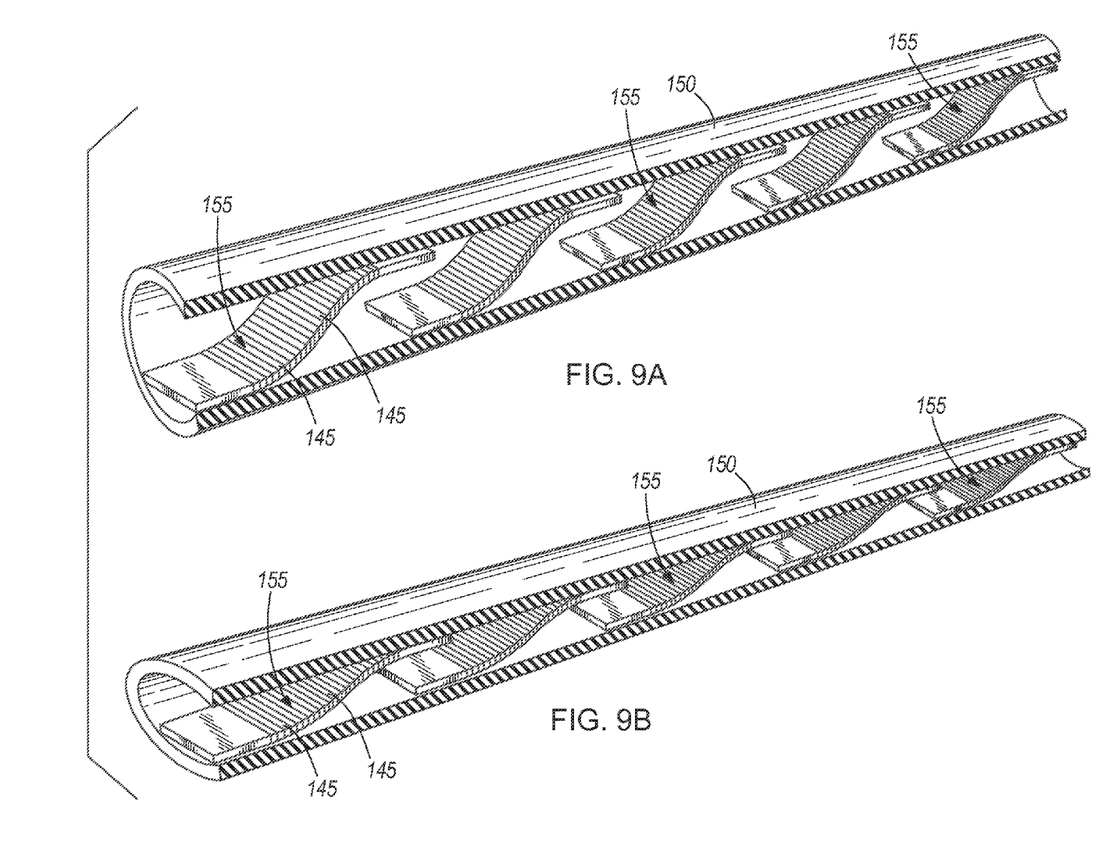
FIG. 9A is a perspective view of one embodiment of the electrical generation system including a door frame liner enclosing piezo-electric film strips with the liner in a non-compressed state.
FIG. 9B is a perspective view of the electrical generation system of FIG. 9A with the liner in a compressed state.
Figures 10A, 10B:
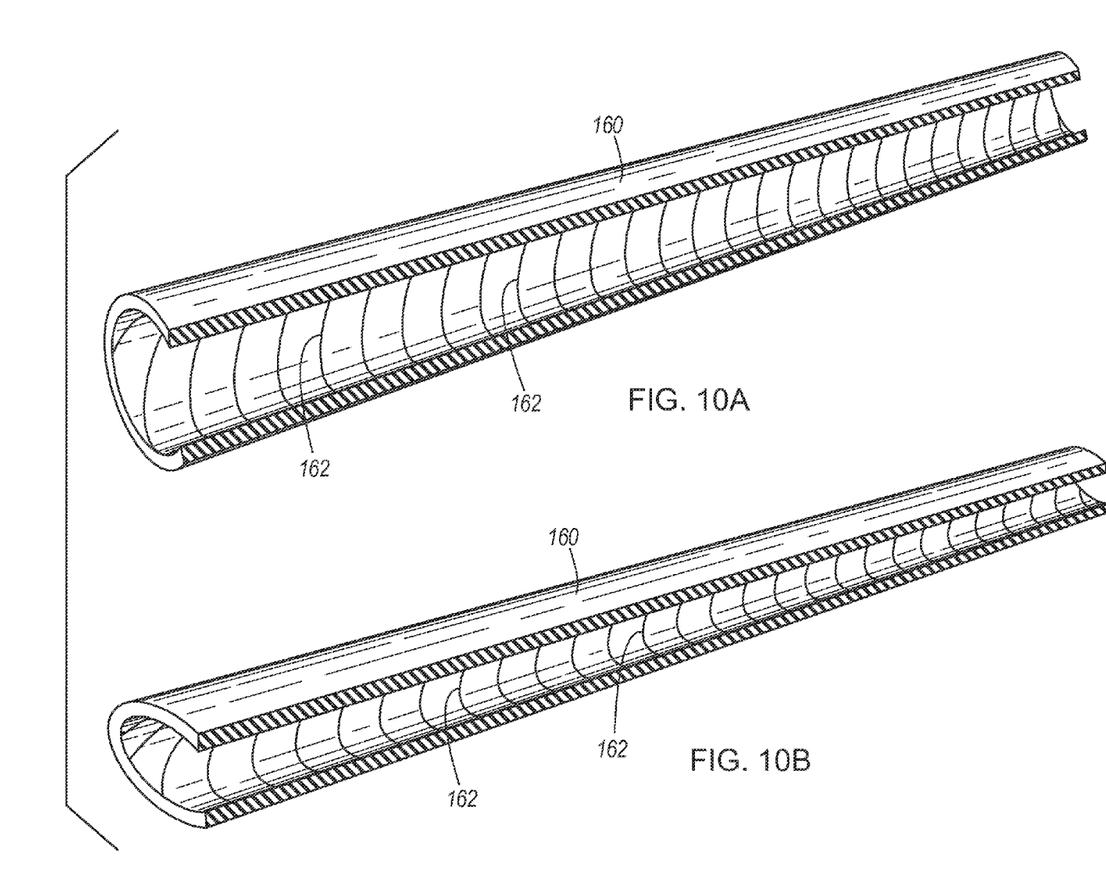
FIG. 10A is a perspective view of another construction the electrical generation system including a door frame liner enclosing piezo-electric fibers with the liner in a non-compressed state.
FIG. 10B is a perspective view of the electrical generation system of FIG. 10A with the liner in a compressed state.

In another construction illustrated in FIGS. 9 and 10, the door frame liner 40 or other flexible interface between the door 10 and the frame 20 is employed to generate electricity using piezo-electric elements 145.

As illustrated in FIG. 1, the electrical generation system includes the door 10, the door frame 20, and weather stripping 40 (or door frame liner) positioned beneath the door 10. The weather stripping 40 includes a strip of elastic material 150 which at least partially encloses one or more piezo-electric members 155. As illustrated in FIG. 9, a series of piezo-electric members 155 are spaced apart from one another with each, including a plurality of piezo-electric elements 160 supported between the uppermost surface of the strip 150 and the lowermost surface of the strip 150. The elastic strip 150 can include fabric, rubber, plastic, or any other elastic material. In some embodiments, the elastic strip 150 can include conductive plastic or conductive rubber. Any suitable commercially available piezo-electric members 155 may be used.

FIG. 9A illustrates the strip 150 in a relaxed position such as when the door 10 is open, while FIG. 9B illustrates the strip 150 in a compressed position such as the position it takes when the door 10 is in the closed position. As the strip 150 moves between the positions of FIGS. 9A and 9B, the piezo-electric elements 145 are compressed or expanded slightly, thereby producing an electric current. The current is directed to the point-of-use and is used in a manner similar to that described with regard to the prior arrangements.

Figure 11:
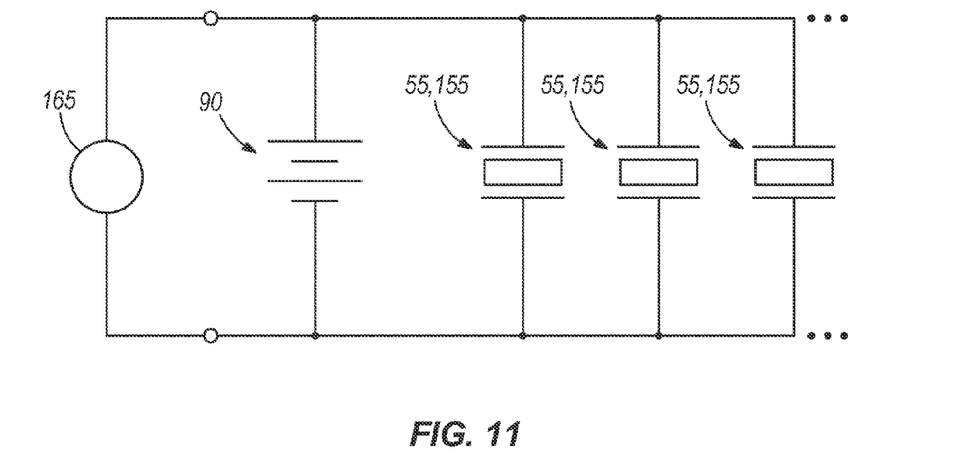
FIG. 11 is a schematic illustration of a circuit suitable for use with the electrical generation system of any of the foregoing figures.

FIGS. 10A and 10B illustrate another arrangement of a strip 160 in which piezo-electric members 162 include piezo-electric fibers 165 that can be attached, woven or enclosed by the elastic strip 160. The piezo-electric members 162 generate electricity which can be stored in the battery 90 (shown in FIG. 11) or used to power an electronic door accessory 165 (e.g., lock, key pad, light, etc.). In one embodiment, the elastic strip 160 of the weather stripping 40 is either conductive plastic or conductive rubber, and the weather stripping 40 itself can be used to transmit electricity from the piezo-electric members 162 to electric door accessory 165 (shown in FIG. 11). In other embodiments the electricity can be transmitted from the piezo-electric members 162 by standard electrical wires that can be connected or embedded in the weather stripping 40.

It should be noted that while some of the embodiments are described as including batteries, virtually any energy storage device (e.g., supercaps, ultracaps, etc.) could be employed in place of or in conjunction with the batteries described herein.

Various features and advantages of the invention are set forth in the following claims.

We claim:

1. An electrical generation system for a doorway including a door, the system comprising:
    a lock mechanism movable between an engaged position and a disengaged position to allow the door to move between a closed position and an open position;
    a cam coupled to the door; and
    a piezo-electric generator coupled to the cam, wherein the cam is rotatable with respect to the piezo-electric generator, wherein the piezo-electric generator is operable to produce an electrical current in response to rotation of the cam with respect to the piezo-electric generator, and wherein the electrical current has a frequency that is greater than the number of revolutions made by the cam with respect to the piezo-electric generator, wherein the cam includes a first surface and a plurality of bumps positioned on the surface, each of the bumps cooperating with an adjacent bump to define a recess therebetween, and wherein the piezo-electric generator includes a roller that engages the first surface and the bumps to move in a cyclic fashion in response to movement of the cam with respect to the piezo-electric generator.

2. The electrical generation system of claim 1, wherein the electrical current has a frequency between 50 Hz and 200 Hz.

3. The electrical generation system of claim 1, wherein the first surface is an outer circumferential surface of the cam.

4. The electrical generation system of claim 1, wherein the first surface is a substantially planar side surface of the cam.

5. The electrical generation system of claim 1, wherein the door includes a hinge and the cam is connected to the hinge for rotation with the door between the closed position and the open position, and wherein the piezo-electric generator is fixedly attached to a stationary frame adjacent the door to generate the electrical current in response to movement of the door.

6. The electrical generation system of claim 1, wherein the door includes a hinge and the cam is connected to the hinge and fixed with respect to a stationary frame of the door, and wherein the piezo-electric generator is fixedly attached to the door for movement with the door to generate the electrical current in response to movement of the door.

7. The electrical generation system of claim 1, wherein the door includes a handle, the lock mechanism moving between the engaged position and the disengaged position in response to movement of the handle, and wherein the cam is coupled to the handle such that the cam rotates in response to movement of the handle.

8. An electrical generation system for a doorway including a door, the system comprising:
    a lock mechanism including a lock and a handle, the handle movable to move the lock between an engaged position and a disengaged position to allow movement of the door between a closed position and an open position;
    a cam coupled to the door and including a cam axis and a first surface having a plurality of bumps and a plurality of recesses therebetween;
    a roller in direct contact with the cam and positioned to engage the bumps and recesses, one of the roller and the cam movable about the cam axis with respect to the other of the roller and the cam such that the movement produces a cyclic movement of the roller;
    a cam driver coupled to the roller and cyclically movable in response to cyclic movement of the roller; and
    a piezo-electric element coupled to the cam driver and operable in response to movement of the cam driver to produce an alternating electric current in which each cycle starts when the roller is in contact with a first of the plurality of bumps and ends when the roller is in contact with a second of the plurality of bumps, the second bump being adjacent the first bump.

9. The electrical generation system of claim 8, wherein the electrical current has a frequency between 50 Hz and 200 Hz.

10. The electrical generation system of claim 8, wherein the first surface is an outer circumferential surface of the cam.

11. The electrical generation system of claim 8, wherein the first surface is a substantially planar side surface of the cam.

12. The electrical generation system of claim 8, wherein the door includes a hinge and the cam is connected to the hinge for rotation with the door between the closed position and the open position, and wherein the piezo-electric element is fixedly attached to a stationary frame adjacent the door.

13. The electrical generation system of claim 8, wherein the door includes a hinge and the cam is connected to the hinge and fixed with respect to a stationary frame of the door, and wherein the piezo-electric element is fixedly attached to the door for movement with the door.

14. The electrical generation system of claim 8, wherein the cam is coupled to the handle such that the cam rotates in response to movement of the handle between the engaged position and the disengaged position.

15. The electrical generation system of claim 8, further comprising a door frame liner attached to one of the door and the door frame, the door frame liner including a strip of elastic material, said strip at least partially enclosing at least one piezo-electric generator.

16. An electrical generation system for a doorway, the system comprising:
    a door slidably supported within the doorway and movable between a closed position and an open position, the door including a first surface that moves along a substantially linear path as the door moves between the open position and the closed position;
    a plurality of bumps positioned along the first surface, each bump cooperating with an adjacent bump to define a recess therebetween;
    a cam driver coupled to the first surface, the cam driver movable into sequential contact with each of the plurality of bumps in response to movement of the door between the open position and the closed position; and
    a piezo-electric element coupled to the cam driver and operable in response to movement of the cam driver to produce an alternating electric current in which each cycle starts when the cam driver is adjacent a first of the plurality of bumps and ends when the cam driver is adjacent a second of the plurality of bumps, the second bump being adjacent the first bump.

17. The electrical generation system of claim 16, wherein the electrical current has a frequency between 50 Hz and 200 Hz.

18. The electrical generation system of claim 16, further comprising a door frame liner attached to one of the door and the door frame, the door frame liner including a strip of elastic material, said strip at least partially enclosing at least one piezo-electric generator.

19. An electrical generation system for a building opening, the system comprising:
    a stationary frame surrounding at least a portion of the opening;
    a movable member supported in the frame for movement between an open position and a closed position, the movable member including an edge having a length;
    a liner positioned between the stationary frame and the movable member and extending along the length of the edge, the liner deflecting in response to movement of the movable member; and
    a piezo electric element coupled to the liner and operable to generate an electric current in response to the deflection of the liner.

20. The electrical generation system of claim 19, wherein the movable member is a door and the liner is a weather strip positioned adjacent a bottom of the door.

21. The electrical generation system of claim 19, wherein the piezo electric element is woven into the liner to define a unitary component that is inseparable without damaging the liner.

22. The electrical generation system of claim 19, wherein the movable member is a window and the liner is a weather strip positioned adjacent the window.

\* \* \* \* \*